United States Patent
Shi et al.

(10) Patent No.: US 12,149,910 B2
(45) Date of Patent: Nov. 19, 2024

(54) SPEAKER

(71) Applicant: AAC Microtech (Changzhou) Co., Ltd., Changzhou (CN)

(72) Inventors: Yang Shi, Shenzhen (CN); Jiasheng Zhou, Shenzhen (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 209 days.

(21) Appl. No.: 18/090,458

(22) Filed: Dec. 28, 2022

(65) Prior Publication Data

US 2024/0080626 A1 Mar. 7, 2024

Related U.S. Application Data

(63) Continuation of application No. PCT/CN2022/125118, filed on Oct. 13, 2022.

(30) Foreign Application Priority Data

Sep. 2, 2022 (CN) .......................... 202222343000.4

(51) Int. Cl.
*H04R 9/06* (2006.01)
*H04R 9/02* (2006.01)
*H04R 9/04* (2006.01)
*H05K 1/18* (2006.01)

(52) U.S. Cl.
CPC ............... *H04R 9/06* (2013.01); *H04R 9/025* (2013.01); *H04R 9/046* (2013.01); *H05K 1/189* (2013.01); *H04R 2499/10* (2013.01)

(58) Field of Classification Search
CPC .......... H04R 9/06; H04R 9/025; H04R 9/046; H04R 2499/10; H05K 1/189
See application file for complete search history.

(56) References Cited

U.S. PATENT DOCUMENTS

2020/0413199 A1* 12/2020 Song ........................ H04R 9/06

* cited by examiner

*Primary Examiner* — Andrew Sniezek
(74) *Attorney, Agent, or Firm* — W&G Law Group

(57) ABSTRACT

A speaker includes: a frame, a vibration system, including a diaphragm and a voice coil assembly, and a magnetic circuit system, comprising a lower plate, a first main magnet and a first auxiliary magnet, a main pole plate, and an upper plate, wherein the upper plate includes a body portion and a groove recessed from the body portion to the lower plate, the groove includes a base, and a connecting arm connected with the body portion and the base, the base is closer to the body portion than the lower plate, the speaker further includes a second auxiliary magnet located in the groove, the base is clamped between the first auxiliary magnet and the second auxiliary magnet.

9 Claims, 4 Drawing Sheets

SPEAKER

TECHNICAL FIELD

The present disclosure relates to an electro-acoustic device, in particular to a speaker used in portable electronic products.

BACKGROUND

With the advent of the mobile internet era, electronic products are being updated faster and faster, and people have higher and higher requirements for the performance of electronic products, one of them is the high-quality music function. Therefore, the performance of the electro-acoustic system needs to be continuously improved, and high-quality speakers are one of the prerequisites for realizing this high-quality music function.

A related speaker usually includes a frame, and a vibration system and a magnetic circuit system fixed to the frame. The vibration system includes a diaphragm and a voice coil driving the diaphragm to vibrate and emit sounds. The magnetic circuit system includes a lower plate, a main magnet and an auxiliary magnet fixed to the lower plate, the main magnet and the auxiliary magnet form a magnetic gap, the voice coil is located in the magnetic gap. When the overall height of the speaker is high, the voice coil is far from the magnetic circuit system, the voice coil can not take full advantage of the magnetic circuit magnetic field, the BL value of the voice coil will be reduced.

Therefore, it is a need to provide an improved speaker to solve the above problems.

SUMMARY

In view of the above, an objective of the present disclosure is to provide a speaker with higher BL value of the voice coil.

In order to achieve the objective mentioned above, the present disclosure discloses a speaker including: a frame, a vibration system fixed to the frame, including a diaphragm fixed to the frame and a voice coil assembly driving the diaphragm to vibrate and emit sounds, and a magnetic circuit system fixed to the frame, comprising a lower plate, a first main magnet and a first auxiliary magnet fixed to the lower plate, a main pole plate attached to a side of the first main magnet far away from the lower plate, and an upper plate attached to a side of the first auxiliary magnet far away from the lower plate, wherein the upper plate includes a body portion and a groove recessed from the body portion to the lower plate, the groove includes a base, and a connecting arm connected with the body portion and the base, the base is closer to the body portion than the lower plate, the speaker further comprises a second auxiliary magnet located in the groove, the base is clamped between the first auxiliary magnet and the second auxiliary magnet.

As an improvement, the speaker further comprises a second main magnet attached to a side of the main pole plate far away from the first main magnet.

As an improvement, the upper plate is in a hollow ring structure, the groove is located at a long axis edge of the upper plate.

As an improvement, the vibration system further comprises a flexible circuit board connected with the voice coil assembly, the flexible circuit board comprises a first fixing portion connected with the frame, a second fixing portion connected with the voice coil assembly, and an elastic arm connected with the first fixing portion and a second fixing portion, the flexible circuit board is located at a short axis edge of the speaker.

As an improvement, the flexible circuit board is arranged between the upper plate and the lower plate, a projection of the elastic arm along the vibration direction of the diaphragm is located in the lower plate.

As an improvement, the first auxiliary magnet is located at a long axis edge of the speaker.

As an improvement, a height of the second auxiliary magnet is equal to a height of the groove.

As an improvement, the diaphragm comprises a dome, and a suspension connected with the dome and the frame, the dome is located at a side of the suspension close to the magnetic circuit system, the voice coil assembly is fixedly connected with the dome.

As an improvement, the voice coil assembly comprises a skeleton connected with the dome and a voice coil connected with the skeleton.

As an improvement, an amount of the flexible circuit boards is four, the four flexible circuit boards are respectively arranged at four corners of the frame, the first pad and the second pad are arranged on different flexible circuit boards.

As an improvement, the magnetic circuit system includes a yoke, and a main magnet and a plurality of auxiliary magnets located on the yoke, the plurality of auxiliary magnets is located around the main magnet and forms the magnetic gap with the main magnet, a plurality of receiving spaces for receiving the flexible circuit boards is formed between adjacent auxiliary magnets.

As an improvement, the magnetic circuit system further includes a main pole plate located on the main magnet and a auxiliary pole plate located on the plurality of auxiliary magnets, the auxiliary pole plate is provided with a plurality of avoiding spaces respectively corresponding to the plurality of receiving spaces, and a projection of each flexible circuit board along the vibration direction of the diaphragm is at least partially located in a corresponding one of the avoiding spaces.

As an improvement, the auxiliary pole plate is a hollow annular structure, and the avoiding spaces are arranged at corners of the auxiliary pole plate.

As an improvement, in the flexible circuit board includes a first fixing arm fixed to the frame, a second fixing arm spaced from the first fixing arm, and an elastic connecting arm connecting the first fixing arm and the second fixing arm, the first pad and the second pad are arranged on the second fixing arm.

As an improvement, the frame includes a plurality of receiving grooves for accommodating the first fixing arms, and each first fixing arm is fixed in a corresponding one of the receiving grooves.

DESCRIPTION OF EMBODIMENTS

Figure 1:
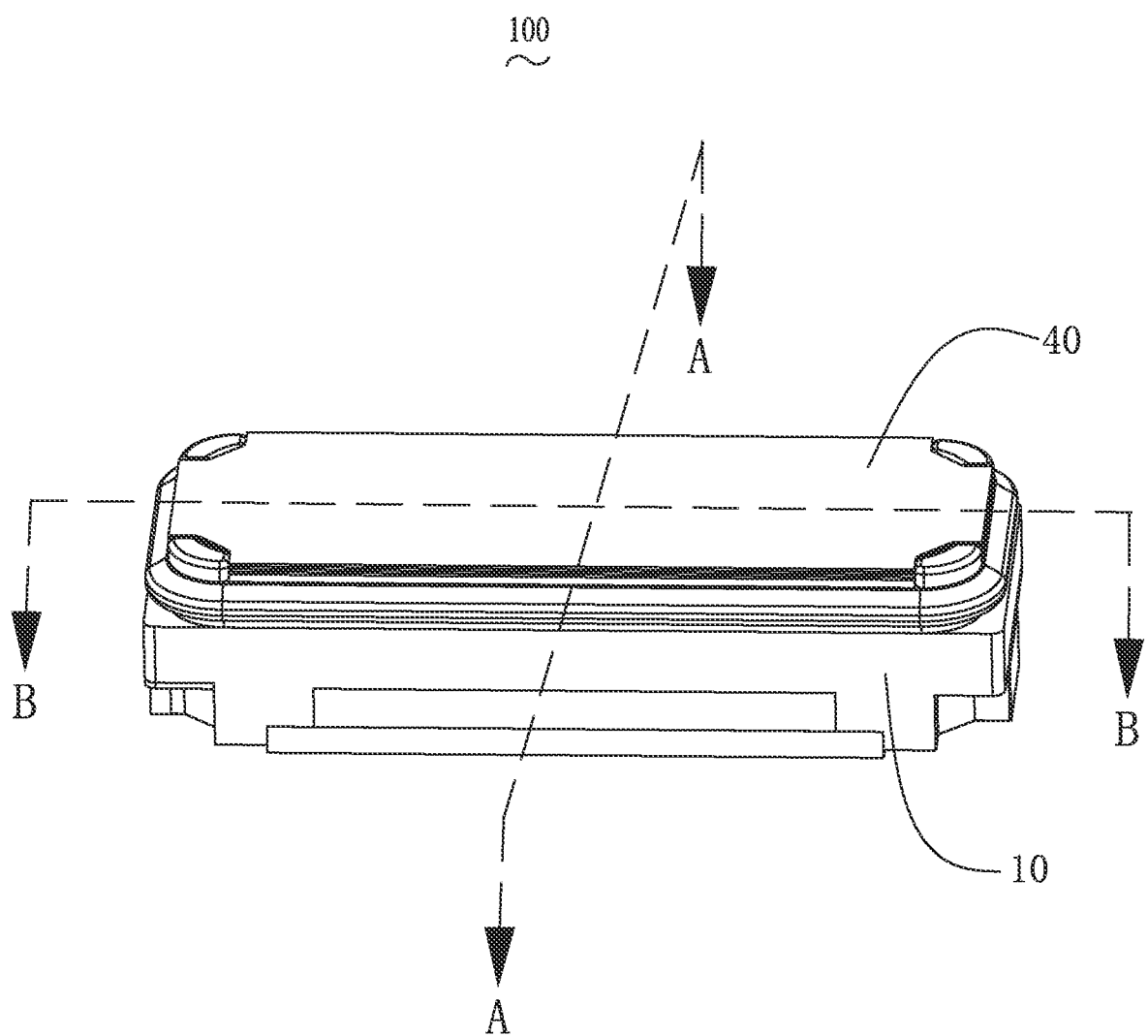
FIG. 1 is an isometric view of a speaker in accordance with an exemplary embodiment of the present disclosure.
Figure 2:
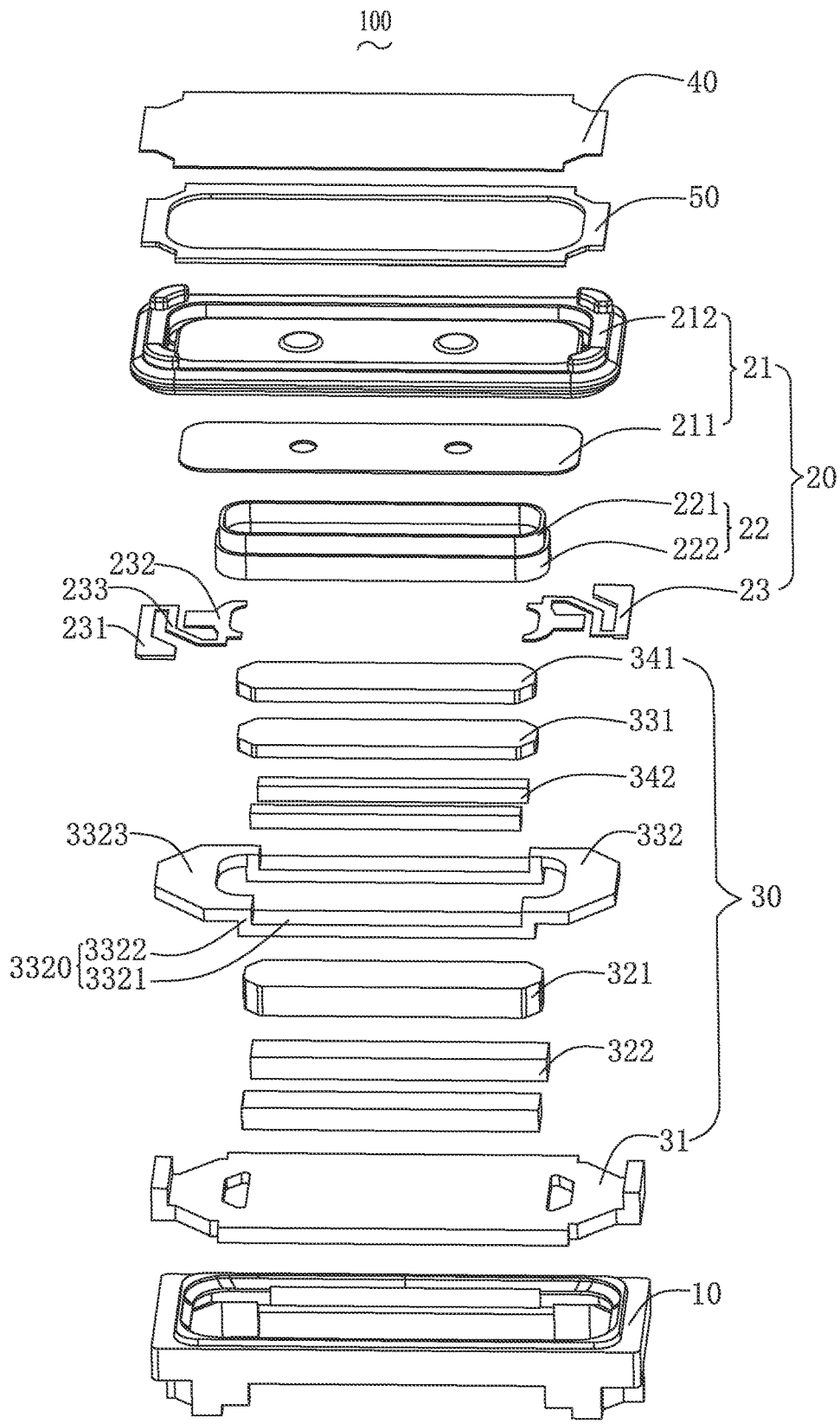
FIG. 2 is an exploded view of the speaker in FIG. 1.
Figure 3:
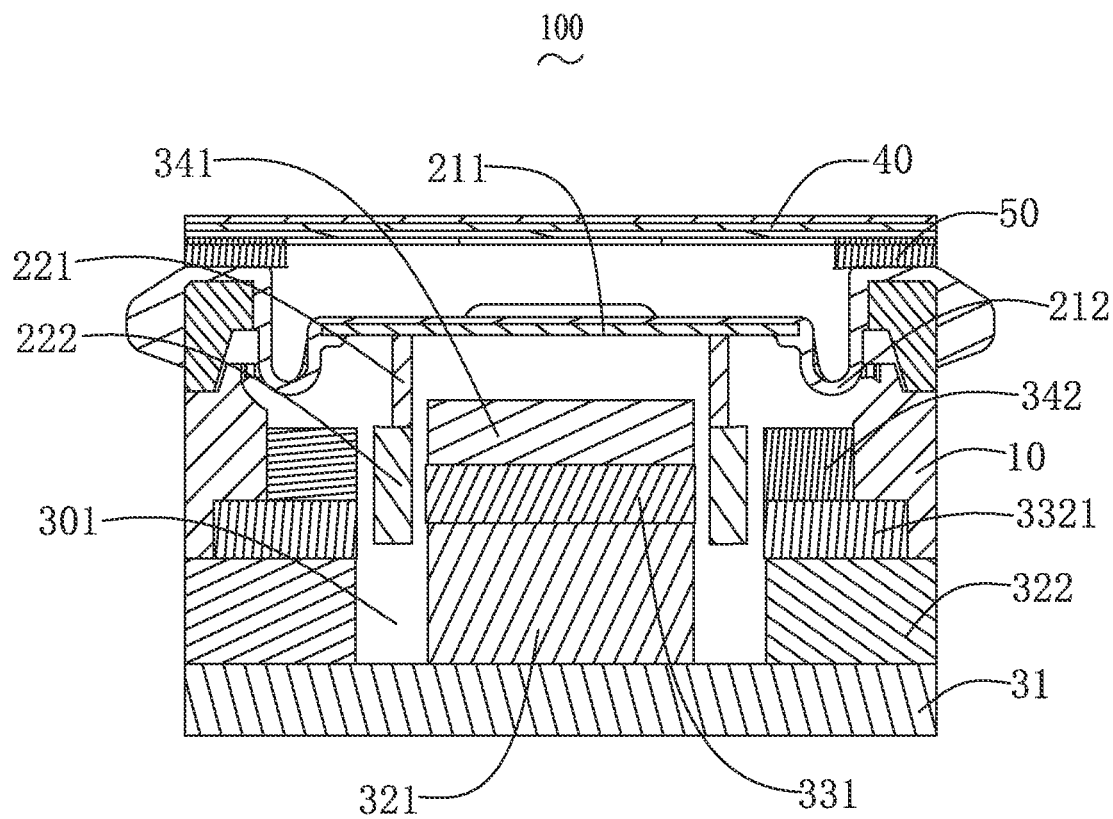
FIG. 3 is a cross-sectional view of the speaker taken along line A-A in FIG. 1.
Figure 4:
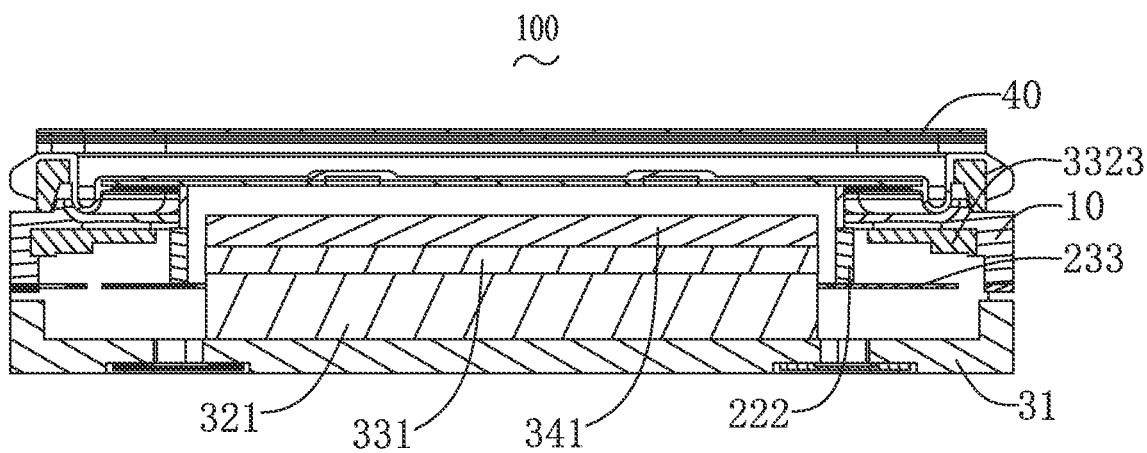
FIG. 4 is a cross-sectional view of the speaker taken along line B-B in FIG. 1.

The technical solutions in embodiments of the present disclosure will be described clearly and completely below with reference to the accompanying drawings in the embodiments of the present disclosure.

As shown in FIGS. 1-4, the present disclosure discloses a speaker 100. The speaker 100 includes a frame 10, and a vibration system 20 and a magnetic circuit system 30 fixed to the frame 10.

The vibration system 20 includes a diaphragm 21, a voice coil assembly 22 driving the diaphragm 21 to vibrate and emit sounds, and a flexible circuit board 23 connected with the voice coil assembly 22. The diaphragm 21 includes a dome 211, and a suspension 212 connected with the dome 211 and the frame 10, the dome 211 is located at a side of the suspension 212 close to the magnetic circuit system 30, the voice coil assembly 22 is fixedly connected with the dome 211. The voice coil assembly 22 includes a skeleton 221 connected with the dome 211 and a voice coil 222 connected with the skeleton 221. The voice coil 222 is closer to the magnetic circuit system 30 by the skeleton 221 than before, thus improving the BL value of the voice coil 222. The flexible circuit board 23 includes a first fixing portion 231 connected to the frame 10, a second fixing portion 232 connected to the voice coil assembly 22, and an elastic arm 233 connected with the first fixing portion 231 and a second fixing portion 232, the flexible circuit board 23 is located at a short axis edge of the speaker 100. The flexible circuit board 23 is not only electrically connected with the voice coil 222, but also provides a fixed support for the voice coil 222.

Figure 5:
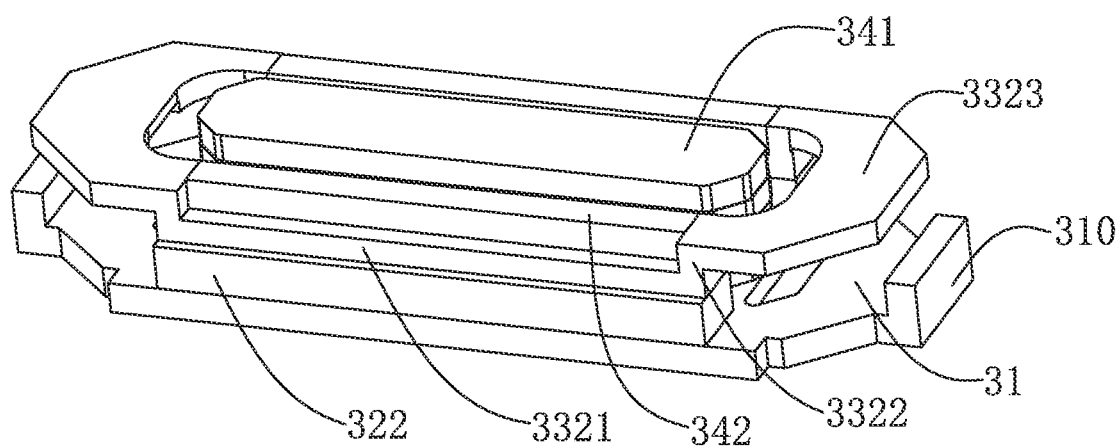
FIG. 5 is an assembled view of the magnetic circuit system in accordance with an exemplary embodiment of the present disclosure.

Referring to FIG. 5, the magnetic circuit system 30 includes a lower plate 31, a first main magnet 321 and a first auxiliary magnet 322 apart from the main magnet 321 fixed to the lower plate 31, a main pole plate 331 attached to a side of the first main magnet 321 far away from the lower plate 31, an upper plate 332 attached to a side of the first auxiliary magnet 322 far away from the lower plate 31, and a second main magnet 341 attached to a side of the main pole plate 331 far away from the first main magnet 321. The first main magnet 321 and the first auxiliary magnet 322 form a magnetic gap 301, the voice coil 222 is located in the magnetic gap 301. The first auxiliary magnet 322 is only located at a long axis side of the speaker 100, and a short axis side of the speaker 100 is not provided with the first auxiliary magnet 322, which can be used to provide a vibration space for the elastic arm 233 of the flexible circuit board 23. The flexible circuit board 23 is arranged between the upper plate 332 and the lower plate 31, a projection of the elastic arm 233 along the vibration direction of the diaphragm 21 is located in the lower plate 31. In addition, the lower plate 31 is provided with an extension portion 310 which bends and extends toward the vibration system 20, the extension portion 310 is located at a short axis side of the lower plate 31.

The upper plate 332 includes a body portion 3323 and a groove 3320 recessed from the body portion 3323 to the lower plate 31, the groove 3320 includes a base 3321, and a connecting arm 3322 connected with the body portion 3323 and the connecting arm 3322, the base 3321 is closer to the lower plate 31 than the body portion 3323, the speaker 100 further includes a second auxiliary magnet 342, the second auxiliary magnet 342 is located in the groove 3320, the base 3321 is clamped between the first auxiliary magnet 322 and the second auxiliary magnet 342. As a result, the internal space of the speaker 100 is fully utilized, and the voice coil 222 can better utilize the magnetic field, the BL value of the voice coil 222 is effectively improved.

In addition, the upper plate 332 is in a hollow ring structure, the groove 3320 is only located at a long axis edge of the upper plate 332. The short axis edge of the upper plate 332 is higher than the long axis edge of the upper plate 332, and the short axis edge of the upper plate 332 can provide vibration space for the flexible circuit board 23 to improve the performance of the speaker 100.

The base 3321 of the groove 3320 is parallel to the body portion 3323, the connecting arm 3322 is perpendicular to the base 3321 and the body portion 3323. In addition, the height of the second auxiliary magnet 342 is flush with the height of the groove 3320, that is, an upper surface of the second auxiliary magnet 342 is flush with an upper surface of the body portion 3323.

The speaker 100 is also provided with an upper cover 50 fixed to the diaphragm 21 and a breathable isolation member 40 that covers the upper cover 50.

Compared with the related art, the above-mentioned speaker effectively improves the performance of the magnetic circuit system 30 by providing a groove 3320 in the lower plate 31 for arranging the second auxiliary magnet 342, while improving the BL value of the voice coil 22.

The above descriptions are merely some of the embodiments of the present disclosure. It should be pointed out that for those of ordinary skill in the art, improvements can be made without departing from the inventive concept of the present disclosure, shall fall within the scope of the present disclosure.

What is claimed is:

1. A speaker, comprising:
a frame,
a vibration system fixed to the frame, comprising a diaphragm fixed to the frame and a voice coil assembly driving the diaphragm to vibrate and emit sounds, and
a magnetic circuit system fixed to the frame, comprising a lower plate, a first main magnet and a first auxiliary magnet fixed to the lower plate, a main pole plate attached to a side of the first main magnet far away from the lower plate, and an upper plate attached to a side of the first auxiliary magnet far away from the lower plate, wherein
the upper plate comprises a body portion and a groove recessed from the body portion to the lower plate, the groove comprises a base, and a connecting arm connected with the body portion and the base, the base is closer to the body portion than the lower plate, the speaker further comprises a second auxiliary magnet located in the groove, the base is clamped between the first auxiliary magnet and the second auxiliary magnet.

2. The speaker described as claim 1, wherein the speaker further comprises a second main magnet attached to a side of the main pole plate far away from the first main magnet.

3. The speaker described as claim 1, wherein the upper plate is in a hollow ring structure, the groove is located at a long axis edge of the upper plate.

4. The speaker described as claim 1, wherein the vibration system further comprises a flexible circuit board connected with the voice coil assembly, the flexible circuit board comprises a first fixing portion connected with the frame, a second fixing portion connected with the voice coil assembly, and an elastic arm connected with the first fixing portion and a second fixing portion, the flexible circuit board is located at a short axis edge of the speaker.

5. The speaker described as claim 4, wherein the flexible circuit board is arranged between the upper plate and the lower plate, a projection of the elastic arm along the vibration direction of the diaphragm is located in the lower plate.

6. The speaker described as claim 5, wherein the first auxiliary magnet is located at a long axis edge of the speaker.

7. The speaker described as claim 1, wherein a height of the second auxiliary magnet is equal to a height of the groove.

8. The speaker described as claim 1, wherein the diaphragm comprises a dome, and a suspension connected with the dome and the frame, the dome is located at a side of the suspension close to the magnetic circuit system, the voice coil assembly is fixedly connected with the dome.

9. The speaker described as claim 8, wherein the voice coil assembly comprises a skeleton connected with the dome and a voice coil connected with the skeleton.

\* \* \* \* \*